United States Patent
Kim et al.

(10) Patent No.: US 11,835,850 B2
(45) Date of Patent: Dec. 5, 2023

(54) RETICLE IN AN APPARATUS FOR EXTREME ULTRAVIOLET EXPOSURE

(71) Applicant: SAMSUNG ELECTRONICS CO., LTD., Suwon-si (KR)

(72) Inventors: Sanghyun Kim, Hwaseong-si (KR); Jinho Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 17/173,245

(22) Filed: Feb. 11, 2021

(65) Prior Publication Data

US 2021/0397076 A1     Dec. 23, 2021

(30) Foreign Application Priority Data

Jun. 18, 2020  (KR) .......................... 10-2020-0074084

(51) Int. Cl.
```
G03F 1/24      (2012.01)
G03F 1/58      (2012.01)
G03F 1/60      (2012.01)
H01L 21/033    (2006.01)
```
(52) U.S. Cl.
CPC .................. *G03F 1/24* (2013.01); *G03F 1/58* (2013.01); *G03F 1/60* (2013.01); *H01L 21/0332* (2013.01); *H01L 21/0337* (2013.01)

(58) Field of Classification Search
CPC ..... G03F 1/24; G03F 1/58; G03F 1/60; G03F 1/22; G03F 1/38; G03F 1/52; G03F 1/54
See application file for complete search history.

(56) References Cited

U.S. PATENT DOCUMENTS

| | | | |
|---|---|---|---|
| 6,913,706 B2 | 7/2005 | Yan et al. | |
| 8,765,330 B2 | 7/2014 | Shih et al. | |
| 9,075,319 B2 | 7/2015 | Hashimoto et al. | |
| 9,921,467 B2 | 3/2018 | Tu et al. | |
| 10,168,612 B2 | 1/2019 | Wistrom | |
| 2005/0277034 A1 | 12/2005 | Mitsui | |
| 2014/0038086 A1* | 2/2014 | Shih | G03F 1/24 430/5 |
| 2017/0263444 A1* | 9/2017 | Shoki | G03F 1/80 |
| 2018/0356719 A1* | 12/2018 | Ikebe | G03F 1/24 |
| 2020/0064726 A1 | 2/2020 | Nozawa et al. | |

FOREIGN PATENT DOCUMENTS

| | | |
|---|---|---|
| JP | 2005-0043571 A | 2/2005 |
| JP | 2011-197375 A | 10/2011 |
| JP | 5067313 B2 | 11/2012 |

* cited by examiner

*Primary Examiner* — Stewart A Fraser
(74) *Attorney, Agent, or Firm* — Lee IP Law, P.C.

(57) ABSTRACT

A reticle in an apparatus for extreme ultraviolet (EUV) exposure includes a substrate having an image area and a black border area surrounding the image area, a multi-layer structure on the image area and the black border area of the substrate, the multi-layer structure to reflect EUV light, a capping layer covering the multi-layer structure, first absorber layer patterns on the capping layer in the image area and the black border area, and an absorber structure on the capping layer in the black border area, the absorber structure including one of the first absorber layer patterns, a hard mask pattern, and a second absorber layer pattern sequentially stacked, the absorber structure covering an entire upper surface of the capping layer in the black border area.

20 Claims, 11 Drawing Sheets

RETICLE IN AN APPARATUS FOR EXTREME ULTRAVIOLET EXPOSURE

CROSS-REFERENCE TO RELATED APPLICATION

Korean Patent Application No. 10-2020-0074084, filed on Jun. 18, 2020, in the Korean Intellectual Property Office, and entitled: "Reticle in an Apparatus for Extreme Ultraviolet Exposure," is incorporated by reference herein in its entirety.

BACKGROUND

1. Field

Example embodiments relate to a reticle in an apparatus for exposure. More particularly, example embodiments relate to a reticle in an apparatus for extreme ultraviolet (EUV) exposure.

2. Description of the Related Art

A reticle used in an EUV exposure process may include an image area and a black border area adjacent to the image area and surrounding the image area. The EUV light may be blocked in the black border area.

SUMMARY

According to example embodiments, there is provided a reticle in an apparatus for EUV exposure that may include a substrate, a multi-layer structure, a capping layer, a plurality of first absorber layer patterns and an absorber layer structure. The substrate may include an image area and a black border area surrounding the image area. The multi-layer structure for reflecting EUV light may be formed on the image area and the black border area of the substrate. The capping layer may cover the multi-layer structure. The first absorber layer patterns may be formed on the capping layer in the image area. The absorber layer structure may be formed on the capping layer in the black border area. The absorber layer structure may include the first absorber layer pattern, a hard mask pattern, and a second absorber layer pattern sequentially stacked. The absorber layer structure may cover an entire upper surface of the capping layer in the black border area.

According to example embodiments, there is provided a reticle in an apparatus for EUV exposure that may include a substrate, a multi-layer structure, a capping layer, a plurality of first absorber layer patterns and an absorber layer structure. The substrate may include an image area, a black border area surrounding the image area, and an edge area surrounding an outside of the black border area. The multi-layer structure for reflecting EUV light may be formed on the image area, the black border area, and the edge area of the substrate. The capping layer may cover the multi-layer structure. The first absorber layer patterns may be formed on the capping layer in the image area. The first absorber layer patterns may be formed on the capping layer in the edge area. The absorber layer structure may be formed on the capping layer in the black border area. The absorber layer structure may include the first absorber layer pattern, a hard mask pattern, and a second absorber layer pattern sequentially stacked. An optical density of the absorber layer structure for EUV light may be higher than 2.8. The absorber layer structure may cover an entire upper surface of the capping layer in the black border area.

According to example embodiments, there is provided a reticle in an apparatus for EUV exposure that may include a substrate, a multi-layer structure, a capping layer, main patterns, a stacked structure, an absorber layer structure. The substrate may include an image area, a black border area surrounding the image area, and an edge area surrounding an outside of the black border area. The multi-layer structure for reflecting EUV light may be formed on the image area, the black border area, and the edge area of the substrate. The capping layer may cover the multi-layer structure. The main patterns may be formed on the capping layer in the image area. Each of the main patterns may include a first absorber layer pattern and an anti-reflection coating layer pattern stacked. A stacked structure may be formed on the capping layer in the edge area. The stacked structure may include the first absorber layer pattern and the anti-reflective coating layer pattern stacked. An absorber layer structure may be formed on the capping layer in the black border area. The absorber layer structure may include the first absorber layer pattern, the anti-reflective coating layer pattern, a hard mask pattern, and a second absorber layer pattern sequentially stacked. A thickness of the hard mask pattern may be less than that of the first absorber layer pattern. The absorber layer may cover an entire upper surface of the capping layer in the black border area.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
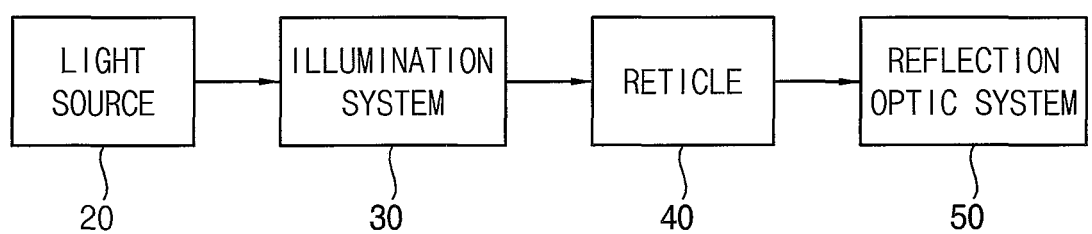
FIG. 1 is a block diagram of an apparatus for EUV exposure.
Figure 2:
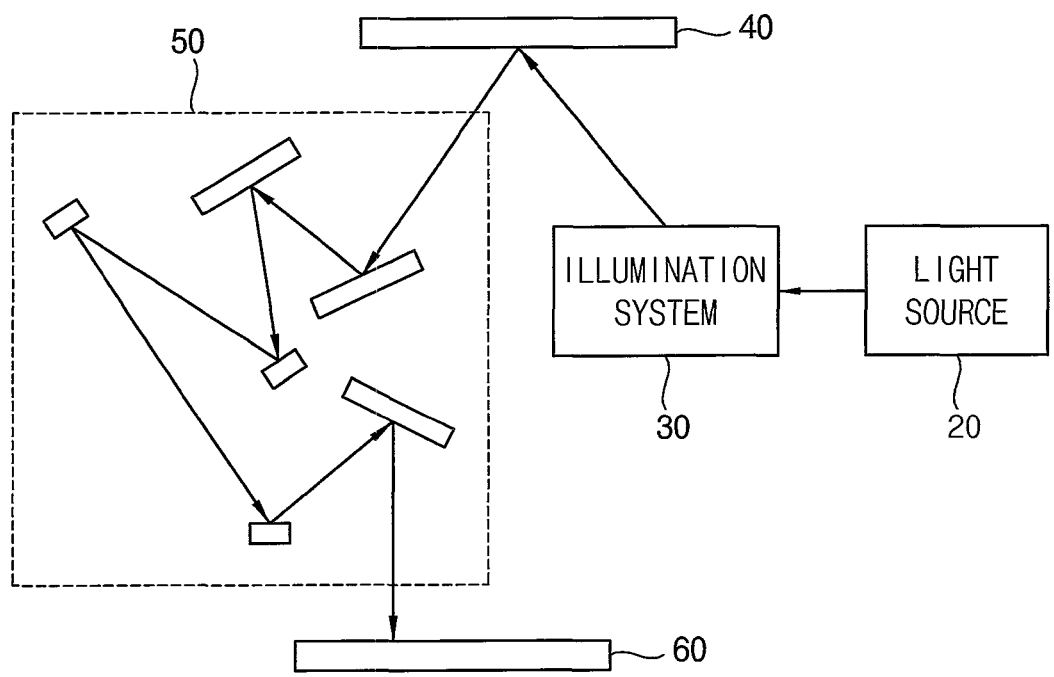
FIG. 2 shows an exposure of a target in an apparatus for the EUV exposure.

FIG. 1 is a block diagram of an apparatus for extreme ultraviolet (EUV) exposure. FIG. 2 shows an exposure of a target in an apparatus for the EUV exposure.

Referring to FIGS. 1 and 2, the apparatus for EUV exposure 10 may include a light source 20, an illumination system 30, a reticle 40, and a reflection optic system 50. The apparatus for EUV exposure 10 may be designed so as to irradiate EUV light onto a photoresist layer on a target substrate 60.

In detail, the light source 20 may generate the EUV light having a wavelength between about 1 nm and about 100 nm. Particularly, the light source 20 may generate the EUV light having a wavelength of about 13.5 nm. The EUV light may be generated by, e.g., a plasma source, a laser induction source, an electric discharge gas plasma source, or the like.

The illumination system 30 may include optical members for guiding the EUV light from the light source 20 to the reticle 40. For example, the illumination system 30 may include a mirror system, or the like.

Patterned light for illuminating onto the photoresist layer on the target substrate 60 may be formed through the reticle 40. The reticle 40 may be loaded on an electrostatic chuck, and thus the reticle 40 may be fixed on the electrostatic chuck. The reflection optic system 50 may guide light reflected from the reticle 40 onto the target substrate 60.

Hereinafter, the reticle 40, i.e., an exposure mask, included in the apparatus for the EUV exposure 10 is mainly described. The reticle 40 may be used interchangeably with an exposure mask hereinafter.

Figure 3:
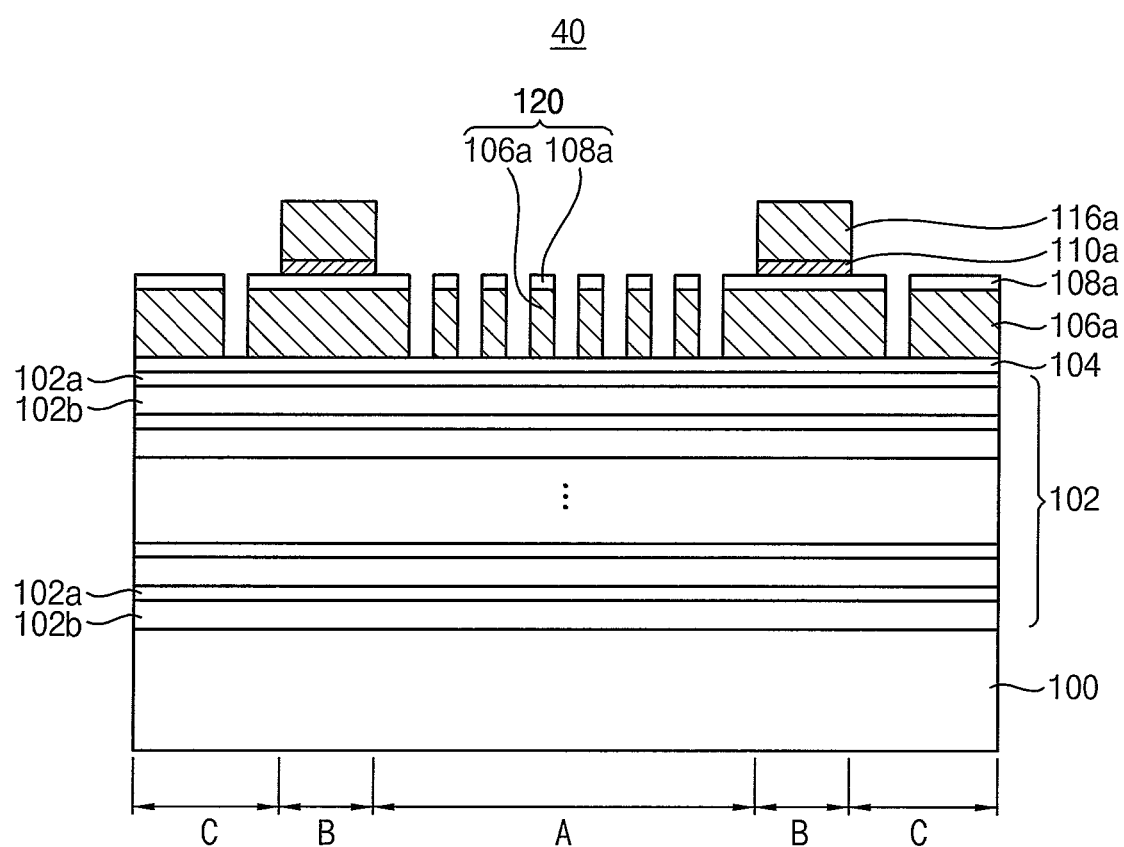
FIG. 3 is a cross-sectional view of a reticle in accordance with example embodiments.
Figure 4:
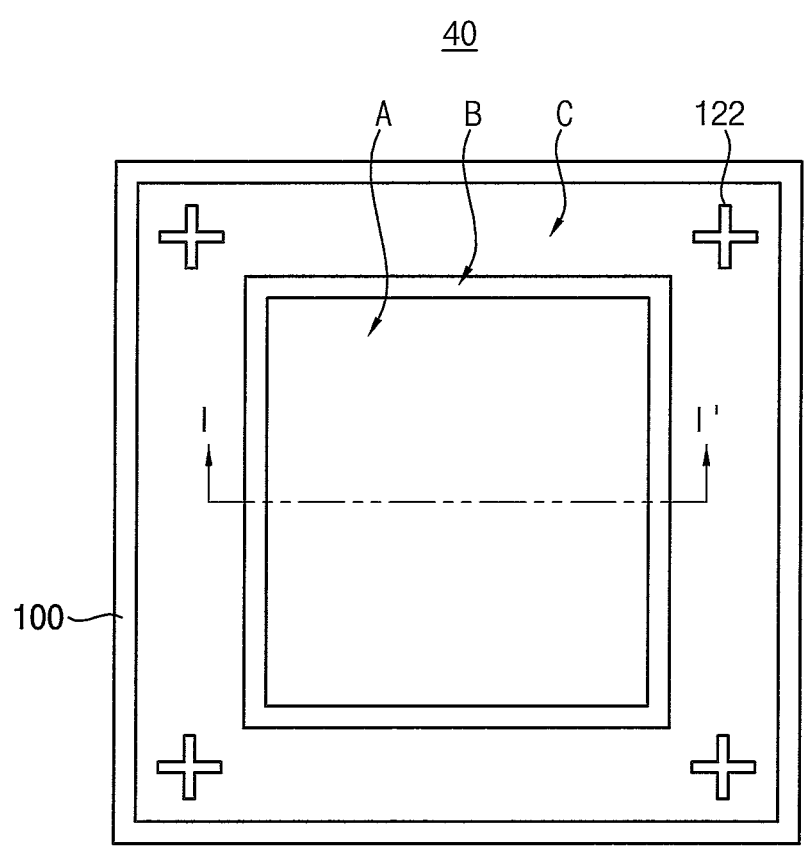
FIG. 4 is a plan view of a reticle in accordance with example embodiments.

FIG. 3 is a cross-sectional view of a reticle in accordance with example embodiments, and FIG. 4 is a plan view of a reticle in accordance with example embodiments. FIG. 3 is a cross-sectional view taken along line I-I' in FIG. 4.

Referring to FIGS. 3 and 4, the reticle 40 may include a substrate 100. The substrate 100 may include a material such as, e.g., doped silicon oxide, quartz, silicon, silicon carbide, and black diamond, etc. For example, the substrate 100 may include $SiO_2$ doped with $TiO_2$. The substrate 100 may be a low thermal expansion material (LTEM) substrate.

The substrate 100 may include an image area A, a black border area B, and an edge area C. The image area A may be an area in which main patterns 120 for forming circuit patterns of a semiconductor chip are formed. The black border area B may be adjacent to the image area A, and may surround, e.g., an entire perimeter of, the image area A. The edge area C may surround, e.g., an entire perimeter of, an outside of the black border area B.

In general, circuit patterns of a semiconductor chip may not be formed by, e.g., adjacent to, the black border area B. That is, as the black border area B is adjacent to the image area A, the black border area B may affect an imaging of an edge region of the semiconductor chip or an imaging of a neighboring semiconductor chip in the image area A. In contrast, according to embodiments, the black border area B may be completely blocked, so that the EUV light may not be transmitted therethrough, e.g., to an edge of the image area A. In example embodiments, the black border area B may be an area within about 1.5 mm to about 5 mm from an edge of the image area A.

A multi-layer structure 102 may be formed on the substrate 100, i.e., on the image area A, the black border area B, and the edge area C. The multi-layer structure 102 may serve as a reflective layer for reflecting of the EUV light. The multi-layer structure 102 may include a plurality of layers 102a and 102b alternately stacked. For example, the multi-layer structure 102 may include a structure in which molybdenum (MO) layers 102b and silicon (Si) layers 102a are alternately stacked. In another example, the multi-layer structure 102 may include a structure in which molybdenum and beryllium (Mo/Be) layers are alternately stacked.

In the multi-layer structure 102, layers having different refractive indices may be alternately stacked to have a predetermined thickness, so that the EUV light may be reflected by a constructive interference due to a phase match of the light and a sum of intensity of the light. A thickness of each of the layers included in the multi-layer structure 102 may be, e.g., about 2 nm to about 7 nm. In the multi-layer structure 102, one set consisting of the alternately stacked layers (e.g. Mo/Si or Mo/Be) may be stacked in about 20 layers to about 100 layers. A total thickness of the multi-layer structure 102 may be about 200 nm to about 400 nm. For example, the total thickness of the multi-layer structure 102 may be about 250 nm to about 300 nm.

In example embodiments, the multi-layer structure 102 may cover an entire upper surface of the substrate 100, except for an outermost portion of the edge area C. That is, the multi-layer structure 102 may cover the upper surface of the substrate 100 including the, e.g., entire, image area A, the, e.g., entire, black border area B, and, e.g., a portion of, the edge area C adjacent to the black border area B.

A capping layer 104 may be formed on the multi-layer structure 102. The capping layer 104 may protect the multi-layer structure 102. For example, the capping layer 104 may prevent oxidation of the multi-layer structure 102.

In example embodiments, the capping layer 104 may include, e.g., ruthenium (Ru). In some example embodiments, the capping layer 104 may include a material including ruthenium and silicon. In example embodiments, the capping layer 104 may have a thickness of about 1 nm to about 10 nm, e.g., about 3 nm to about 4 nm.

The main patterns 120, in which a first absorber layer pattern 106a and an anti-reflection coating (ARC) layer pattern 108a are stacked, may be formed on the capping layer 104 in the image area A. The first absorber layer pattern 106a and the ARC layer pattern 108a may be stacked on the capping layer 104 in the edge area C. A hard mask pattern 110a may not be formed on the ARC layer pattern 108a in the image area A and the edge area C.

An absorber layer structure, in which the first absorber layer pattern 106a, the ARC layer pattern 108a, the hard mask pattern 110a, and a second absorber layer pattern 116a are sequentially stacked, may be formed on the capping layer 104 in the black border area B. For example, the absorber layer structure may completely cover an upper surface of the capping layer 104 in the black border area B.

In detail, the first absorber layer pattern 106a in the image area A may serve for imaging of the circuit pattern. The EUV light may be absorbed at the first absorber layer patterns 106a, and the EUV light may be transmitted at a portion between the first absorber layer patterns 106a in the image area A. For example, as illustrated in FIG. 3, a plurality of the first absorber layer patterns 106a may be formed in the image area A with spaces therebetween, so the EUV light may be transmitted between adjacent ones of the first absorber layer patterns 106a, e.g., a width of each of the first absorber layer patterns 106a in a horizontal direction (i.e., a direction parallel to an upper surface of the substrate 100) may be smaller than its thickness in a vertical direction (i.e., a direction perpendicular to an upper surface of the substrate 100).

The first absorber layer pattern 106a may have a thickness for imaging the circuit pattern. In example embodiments, the first absorber layer pattern 106a may have a thickness of about 20 nm to about 60 nm, e.g., about 50 nm to about 60 nm. When the thickness of the first absorber layer pattern 106a is less than 20 nm or greater than 60 nm, the imaging of the circuit pattern may be difficult. The thickness of the first absorber layer pattern 106a may be greater than the thickness of the capping layer 104 e.g., along the vertical.

The first absorber layer pattern 106a may include a single layer or a plurality of layers. In example embodiments, the first absorber layer pattern 106a may include nickel, nickel alloy, tantalum, tantalum alloy, platinum, or platinum alloy. For example, the first absorber layer pattern 106a may include TaN or TaBN. In some example embodiments, the first absorber layer pattern 106a may include molybdenum, palladium, zirconium, nickel silicide, titanium, titanium nitride, chromium, chromium oxide, aluminum oxide, aluminum-copper alloy, or the like. The first absorber layer pattern 106a may include a binary intensity mask type or an attenuated phase shift mask (PSM) type.

In example embodiments, the ARC layer pattern 108a may include TaO, TaBO, Cr$_2$O$_3$, ITO, SiO$_2$, silicon nitride, TaO, or the like. For example, the ARC layer pattern 108a may include TaBO.

In example embodiments, the ARC layer pattern 108a may directly contact an upper surface of the first absorber layer pattern 106a, and may have a uniform thickness. As the ARC layer pattern 108a is formed, a native oxide layer having irregular thickness may not be formed on the upper surface of the first absorber layer pattern 106a.

The ARC layer pattern 108a may have a thickness less than the thickness of the first absorber layer pattern 106a, e.g., each ARC layer pattern 108a may have a same width as an underlying first absorber layer pattern 106a to completely cover the upper surface of the first absorber layer pattern 106a. In some example embodiments, the ARC layer pattern 108a may not be formed.

The first absorber layer pattern 106a and the ARC layer pattern 108a in the black border area B may completely cover an upper surface of the capping layer 104. For example, referring to FIGS. 3-4, one single and continuous first absorber layer pattern 106a may be formed in the black border area B, e.g., to have a quadrangular frame shape (FIG. 4), to cover the entire upper surface of the capping layer 104 in the black border area B, with the ARC layer pattern 108a thereon. For example, the first absorber layer pattern 106a in the black border area B and the plurality of first absorber layer patterns 106a in the image area A may be formed simultaneously of a same layer, as will be discussed in more detail below, with the first absorber layer pattern 106a in the black border area B having a different width and a different shape in a top view, as compared to the plurality of first absorber layer patterns 106a in the image area A (FIGS. 3 and 4).

The hard mask pattern 110a may completely cover an upper surface of the ARC layer pattern 108a in the black border area B. For example, as illustrated in FIG. 3, the first absorber layer pattern 106a and the ARC layer pattern 108a may cover the black border area B and continuously extend beyond the black border area B, e.g., into the image area A and into the edge area C, and the hard mask pattern 110a may have a smaller width in the horizontal direction than the first absorber layer pattern 106a to extend only in the, e.g., entire, black border area B.

The hard mask pattern 110a may serve as an etching mask for forming the main patterns 120 formed by patterning of the first absorber layer in the image area A. After forming the main patterns 120, the hard mask pattern 110a in the image area A and the edge area C may be removed. Thus, the hard mask pattern 110a may not remain in the image area A and the edge area C.

The hard mask pattern 110a may include a material having a high etch selectivity with respect to the first absorber layer pattern 106a. In example embodiments, the hard mask pattern 110a may include chromium (Cr), chromium nitride (CrN), silicon oxynitride (SiON), silicon nitride (SiN), or the like.

The hard mask pattern 110a may have a thin thickness, e.g., along the vertical direction, so that a first absorber layer may be accurately patterned with high resolution. The thickness of the hard mask pattern 110a may be less than the thickness of the first absorber layer pattern 106a. In example embodiments, the hard mask pattern 110a may have a thickness of about 3 nm to about 20 nm. When a thickness of the hard mask pattern 110a is less than about 3 nm, the hard mask pattern 110a may be mostly consumed during an etching process. When a thickness of the hard mask pattern 110a is greater than 20 nm, an aspect ratio of the hard mask pattern 110a may be increased, and thus the first absorber layer may not be accurately patterned by the hard mask pattern 110a.

A second absorber layer pattern 116a may be formed on the hard mask pattern 110a in the black border area B. The second absorber layer pattern 116a may cover an, e.g., entire, upper surface of the hard mask pattern 110a in the black border area B, and thus, the upper surface of the hard mask pattern 110a may not be exposed. The hard mask pattern 110a and the second absorber layer pattern 116a may not be formed on the image area A and the edge area C.

In example embodiments, an upper surface of the second absorber layer pattern 116a may be substantially flat. That is, the upper surface of the second absorber layer pattern 116a may not have a patterned shape.

The second absorber layer pattern 116a may completely absorb the EUV light in the black border area B. For example, the second absorber layer pattern 116a may include a material having a high absorption coefficient. In example embodiments, the second absorber layer pattern 116a may include nickel, nickel alloy, tantalum, tantalum alloy, platinum or platinum alloy. For example, the second absorber layer pattern 116a may include TaN or TaBN. In some example embodiments, the second absorber layer pattern 116a may include molybdenum, palladium, zirconium, nickel silicide, titanium, titanium nitride, chromium, chromium oxide, aluminum oxide, aluminum-copper alloy, or the like.

The hard mask pattern 110a and the second absorber layer pattern 116a may be formed by a photolithography process, and thus the hard mask pattern 110a and the second absorber layer pattern 116a may be accurately formed at a predetermined position. That is, the hard mask pattern 110a and the second absorber layer pattern 116a may be accurately positioned on only the black border area B among all the areas of the substrate 100. Thus, the EUV light may be effectively absorbed at an entirety of the black border area B including an edge of the black border area B. Accordingly, the black border area B may not include a region in which the EUV light is not effectively absorbed.

The absorber layer structure in the black border area B may cover an entire upper surface of the capping layer 104 in the black border area B. The absorber layer structure may have a high absorption rate of the EUV light. In example embodiments, the absorber structure may have an optical density (OD) defined as −log (reflectivity of the absorber layer structure)/(reflectivity of the multi-layer structure), and is greater than 2.8. That is, the material and the thickness of the second absorber layer pattern 116a may be adjusted so that the absorber structure may have an OD for the EUV light greater than 2.8. The material and the thickness of the second absorber layer pattern 116a may vary depending on the absorption rate of the EUV light of the first absorber layer pattern 106a.

The absorption rate of the EUV light of the absorber layer structure in which the first absorber layer pattern 106a has the attenuated PSM type may be higher than the absorption rate of the EUV light of the absorber layer structure in which the first absorber layer pattern 106a has the binary intensity mask type. Therefore, in the absorber structure, a thickness of the second absorber layer pattern 116a, in a case of the first absorber layer pattern 106a with the attenuated PSM type, may be greater than a thickness of the second absorber layer pattern 116a, in a case of the first absorber layer pattern 106a with the binary intensity mask type.

For example, when the first absorber layer pattern 106a has a binary intensity mask type and the second absorber layer pattern 116a includes TaBN, the thickness of the second absorber layer pattern 116a may be greater than 38 nm. For example, when the first absorber layer pattern 106a has a binary intensity mask type and the second absorber layer pattern 116a includes Ni, the thickness of the second absorber layer pattern 116a may be greater than 16 nm. For example, when the first absorber layer pattern 106a has an attenuating PAM mask type and the second absorber layer pattern 116a includes TaBN, the thickness of the second absorber layer pattern 116a may be greater than 28 nm. For example, when the first absorber layer pattern 106a is of the attenuation PSM mask type and the second absorber layer pattern 116a includes Ni, the thickness of the second absorber layer pattern 116a may be greater than 6 nm.

As described above, as the hard mask pattern 110a and the second absorber layer pattern 116a are further stacked in the black border area B, the EUV light may be effectively absorbed at the black border area B.

A structure including the first absorber layer pattern 106a and the ARC layer pattern 108a may be formed on an upper surface of the capping layer 104 in the edge area C. An alignment key (refer to FIG. 4, 122) formed by patterning a portion of the structure may be disposed at the edge area C.

The reticle 40 may be loaded into the apparatus for EUV exposure 10, and an EUV exposure process may be performed on the photoresist layer on the target substrate 60, e.g., a semiconductor wafer, using the reticle 40. Thus, photoresist patterns may be formed on the target substrate 60.

When the exposure process is performed using the reticle 40, the EUV light may be completely absorbed in the black border area B, so that the EUV light may not be irradiated to the target substrate 60 from the black border area B. Further, the black border area B may not include any regions in which the EUV light is not effectively absorbed. The hard mask pattern 110a and the second absorber layer pattern 116a may not be formed in the image area A and the edge area C.

Therefore, a target photoresist pattern may be formed on the target substrate 60 by the exposure process using the reticle 40. Particularly, defects of the photoresist pattern may not occur at an edge region of a semiconductor chip.

FIGS. 5 to 12 are cross-sectional views of stages in a method of manufacturing a reticle in accordance with example embodiments.

Figure 5:
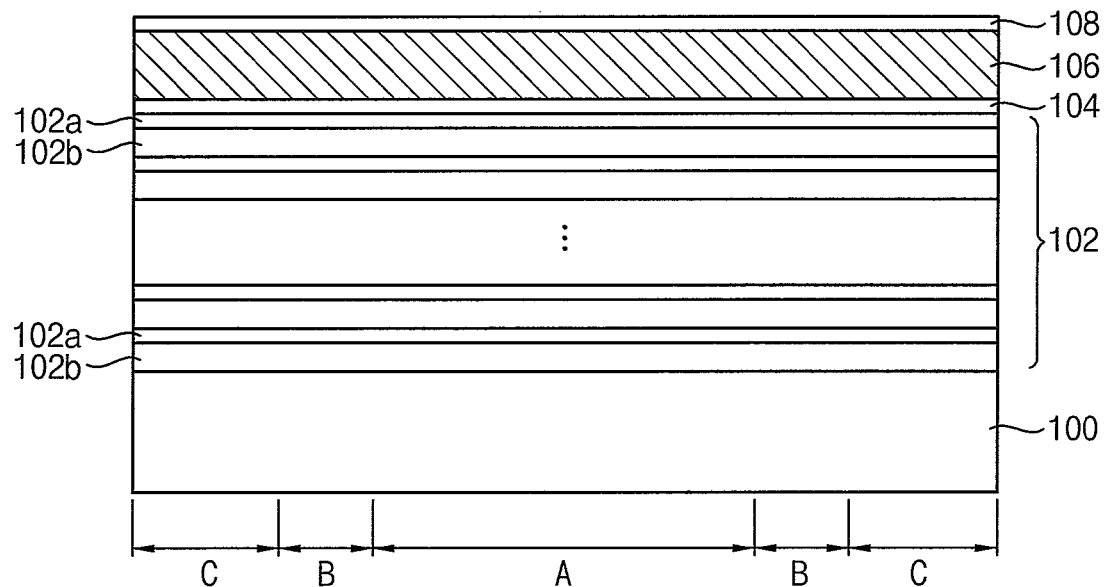
FIGS. 5 to 12 are cross-sectional views of stages in a method of manufacturing a reticle in accordance with example embodiments.

Referring to FIG. 5, the substrate 100 may include the image area A, the black border area B, and the edge area C. The multi-layer structure 102 may be formed in the image area A, the black border area B, and the edge area C of the substrate 100.

In example embodiments, the multi-layer structure 102 may be formed by alternately stacking molybdenum (MO) layers 102b and silicon (Si) layers 102a. In some example embodiments, the multi-layer structure 102 may be formed by alternately stacking molybdenum (MO) layers and beryllium (Be) layers. In example embodiments, layers included in the multi-layer structure 102 may be formed by, e.g., a physical vapor deposition (PVD) process, a chemical vapor deposition (CVD) process, an atomic layer deposition (ALD) process, or the like.

The capping layer 104 may be formed on an upper surface of the multi-layer structure 102. In example embodiments, the capping layer 104 may be formed by the PVD process, the CVD process, the ALD process, or the like.

A first absorber layer 106 may be formed on the capping layer 104. In example embodiments, the first absorber layer 106 may be formed by the PVD process, the CVD process, the ALD process, or the like.

An ARC layer 108 may be formed on the first absorber layer 106. The ARC layer 108 may be formed by the PVD process, the CVD process, the ALD process, or the like.

Figure 6:
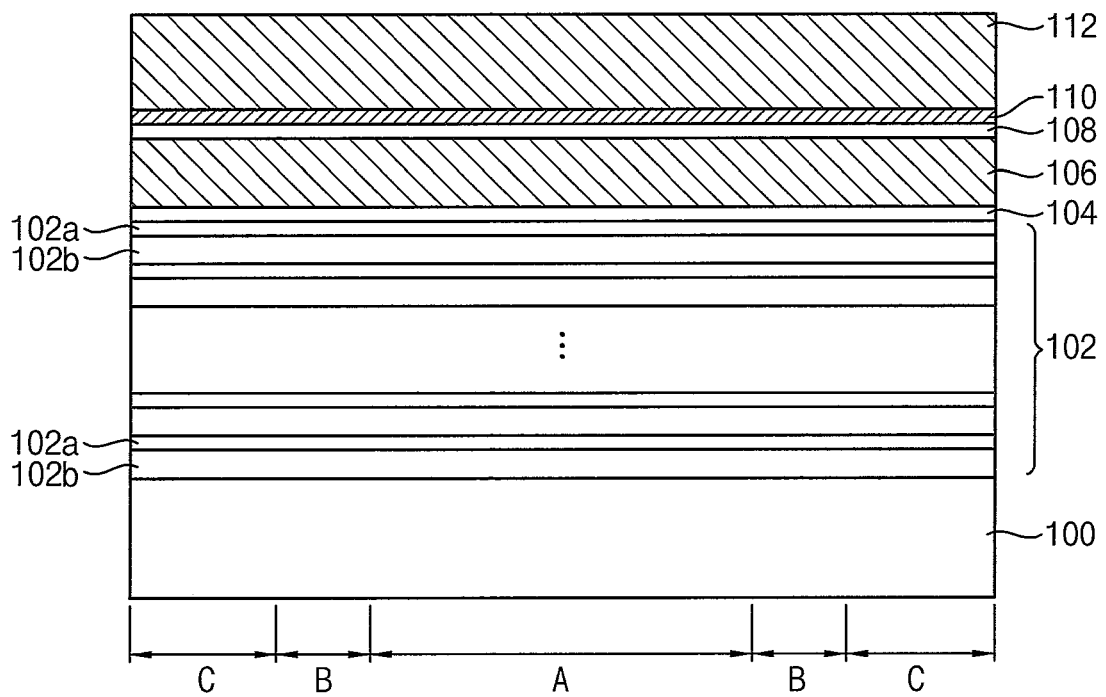

Referring to FIG. 6, a hard mask layer 110 may be formed on the ARC layer 108. The hard mask layer 110 may serve as an etching mask in a subsequent process for forming a main pattern by patterning the ARC layer 108 and the first absorber layer 106. Thus, the hard mask layer 110 may include a material having a high etch selectivity with respect to the first absorber layer 106.

The hard mask layer 110 may have a suitable thickness so that the first absorber layer 106 may be patterned to have a fine line width. The hard mask layer 110 may have a thickness less than a thickness of the first absorber layer 106. In example embodiments, the hard mask layer 110 may have the thickness of about 3 nm to about 20 nm.

A second absorber layer 112 may be formed on the hard mask layer 110. In example embodiments, the second absorber layer 112 may be formed by the PVD process, the CVD process, the ALD process, or the like. The second absorber layer 112 may serve as a second absorber layer pattern by subsequent patterning processes.

The second absorber layer 112 may be formed to have a thickness greater than a thickness of a second absorber layer pattern subsequently formed. The second absorber layer 112 may be partially etched during subsequent etching processes for patterning the first absorber layer 106. Thus, the thickness of the second absorber layer 112 may be greater than the thickness of the second absorber layer pattern in consideration of the thickness of the second absorber layer 112 to be etched. That is, the thickness of the second absorber layer 112 may be equal to a sum of the thickness of the second absorber layer 112 to be etched in a subsequent etching process and the second absorber layer pattern.

Figure 7:
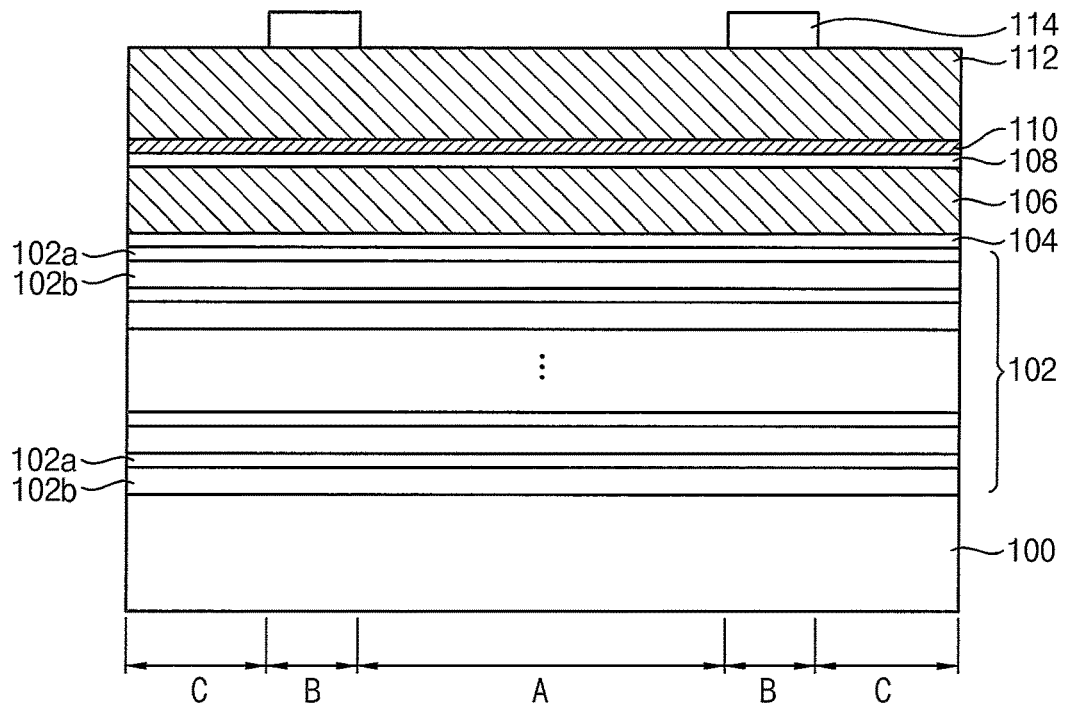

Referring to FIG. 7, a first photoresist layer may be coated to cover the second absorber layer 112. Thereafter, a first photoresist pattern 114 may be formed on the second absorber layer 112 by a photo process. The first photoresist pattern 114 may cover only the second absorber layer 112 in the black border area B. Thus, the second absorber layer 112 in the image area A and the edge area C may be exposed.

Figure 8:
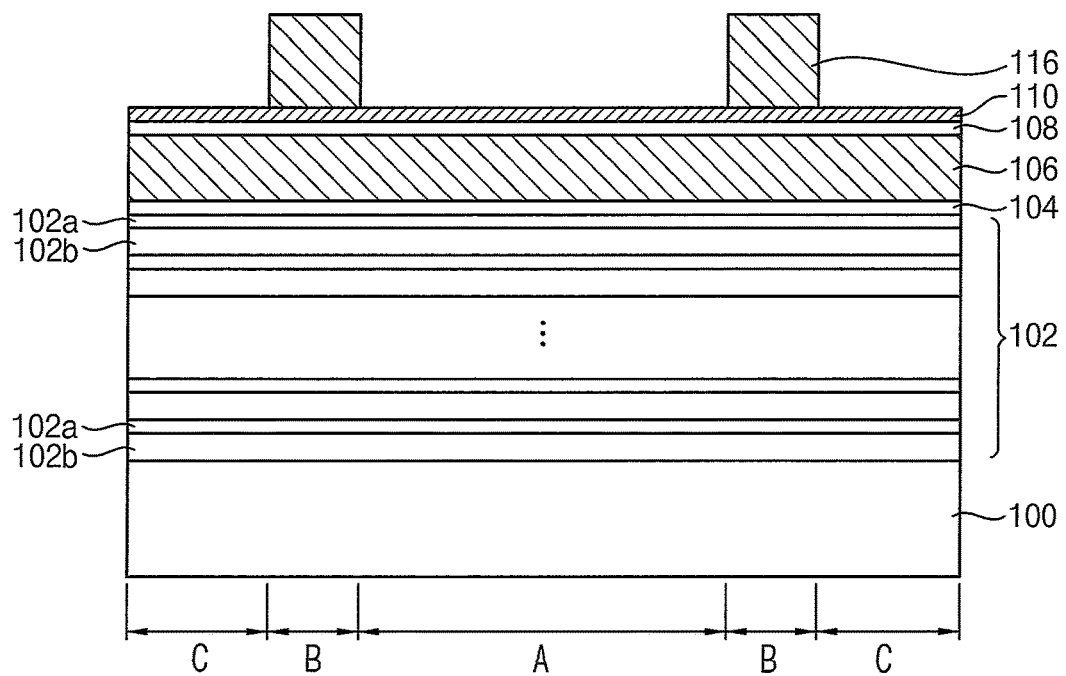

Referring to FIG. 8, the second absorber layer 112 in the image area A and the edge area C may be etched using the first photoresist pattern 114 as an etching mask. Thus, a preliminary second absorber layer pattern 116 may be formed on the hard mask layer 110 in the black border area B. In addition, the hard mask layer 110 may be exposed at the image area A and the edge area C.

The etching process may include an anisotropic etching process. Therefore, a sidewall of the preliminary second absorber layer pattern 116 may have a vertical slope from an upper surface of the substrate 100. The second absorber layer 112 may be patterned by a photolithography process, so that the preliminary second absorber layer pattern 116 may be formed to be accurately formed only on the black border area B.

During the etching process, the first photoresist pattern 114 may be mostly removed. After performing the etching process, a remaining first photoresist pattern 114 may be removed by a stripping process.

Figure 9:
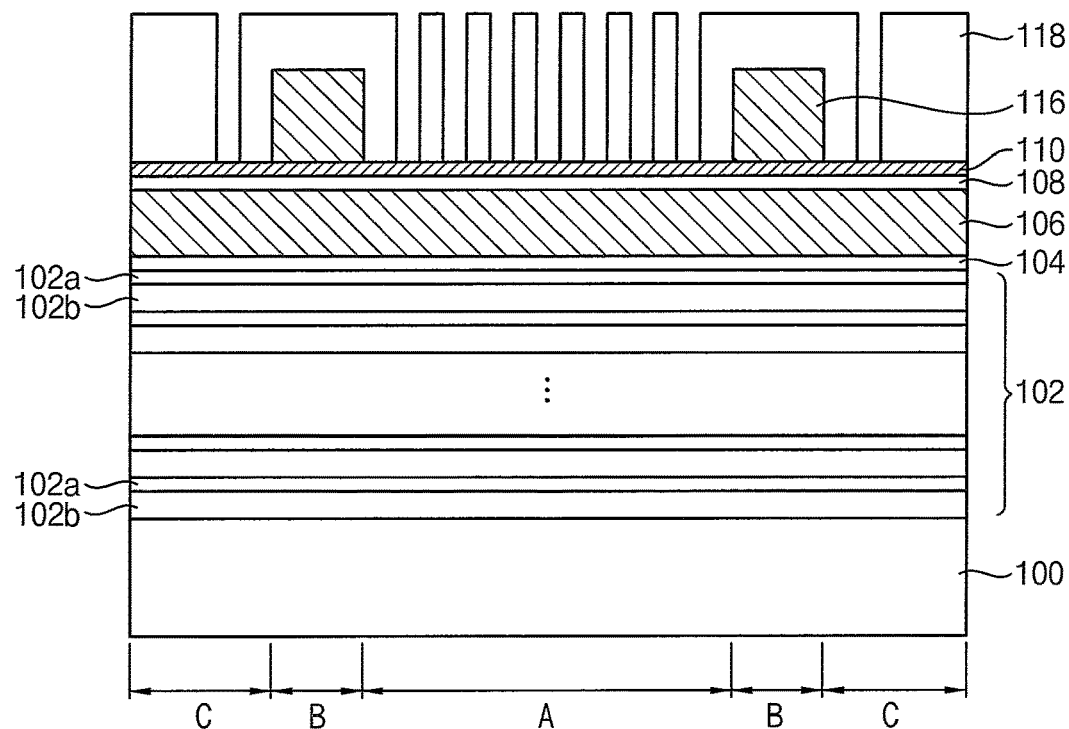

Referring to FIG. 9, a second photoresist layer may be coated to cover the preliminary second absorber layer pattern 116 and the hard mask layer 110. Thereafter, a second photoresist pattern 118 may be formed on the preliminary second absorber layer pattern 116 and the hard mask layer 110 by a photo process.

The second photoresist pattern 118 may completely cover the preliminary second absorber layer pattern 116 in the black border area B. The second photoresist pattern 118 may cover the hard mask layer 110 in the edge area C. In addition, the second photoresist pattern 118 may include openings between a plurality of patterns for forming a main pattern on the hard mask layer 110 in the image area A. In example embodiments, an opening between the second photoresist patterns may be further formed in the edge area C adjacent to a boundary between the black border area B and the edge area C.

Figure 10:
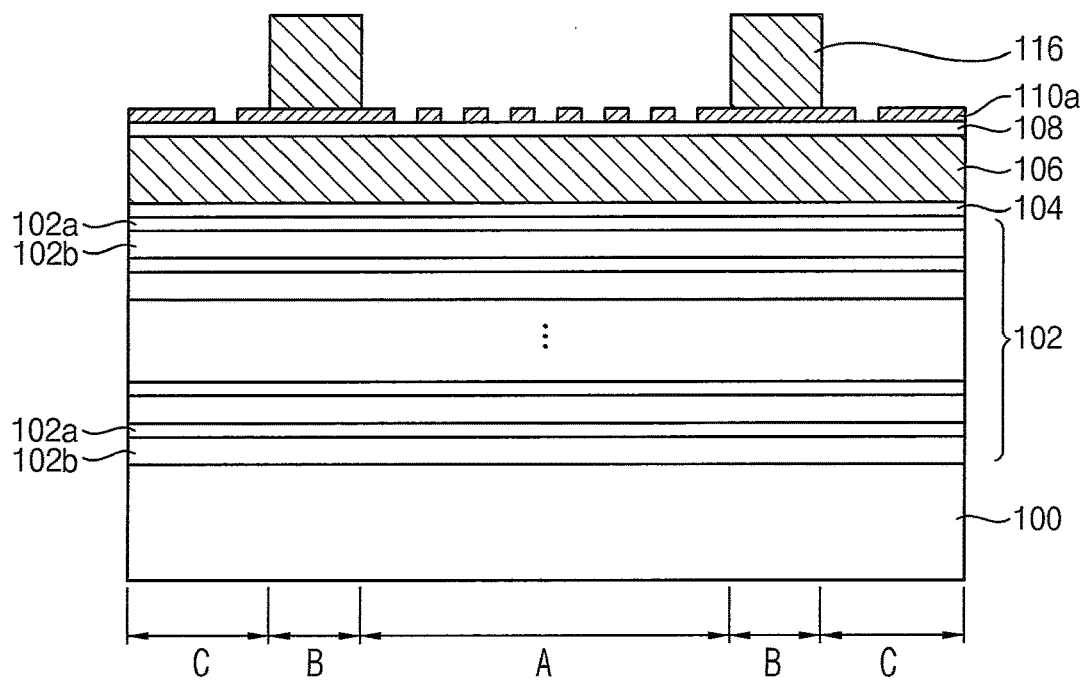

Referring to FIG. 10, the hard mask layer 110 may be etched using the second photoresist pattern 118 as an etching mask to form the hard mask patterns 110a. An upper surface of the ARC layer 108 may be exposed between the hard mask patterns 110a.

During the etching process, the second photoresist pattern 118 may be mostly removed. After performing the etching process, remaining portions of the second photoresist pattern 118 may be removed by a stripping process.

Figure 11:
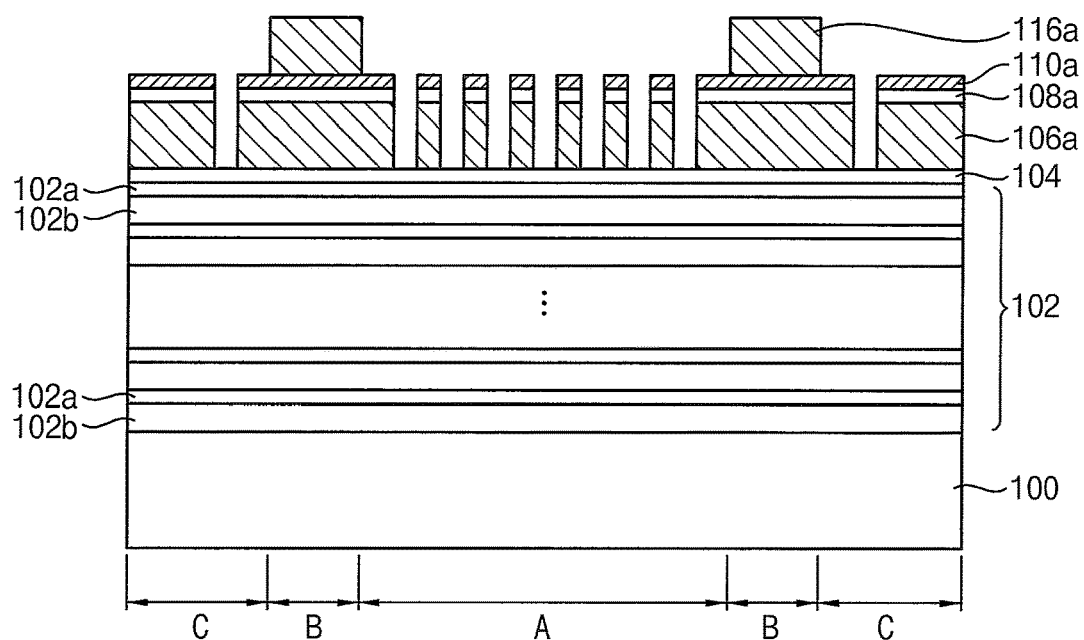

Referring to FIG. 11, the ARC layer 108 and the first absorber layer 106 may be sequentially and anisotropically etched using the hard mask patterns 110a as an etching mask. When the etching process is performed, the first absorber layer pattern 106a and the ARC layer pattern 108a may be formed in the image area A.

The hard mask pattern 110a may not be formed on the preliminary second absorber layer pattern 116. Therefore, during the etching process, an upper surface of the preliminary second absorber layer pattern 116 may be partially etched. Thus, a thickness of the preliminary second absorber layer pattern 116 may be reduced to form the second absorber layer pattern 116a. The second absorber layer pattern 116a may have a target thickness. An absorber layer structure, in which the first absorber layer pattern 106a, the ARC layer pattern 108a, the hard mask pattern 110a, and the second absorber layer pattern 116a are stacked, may be formed in the black border area B. In example embodiments, the absorber layer structure may have an OD for EUV light greater than 2.8. In this case, the upper surface of the second absorber layer pattern 116a may be substantially flat.

The second absorber layer pattern 116a may be formed only on the black border area B. In addition, the absorber layer structure may cover the entire upper surface of the capping layer 104 of the black border area B.

The upper surface of the hard mask pattern 110a under the second absorber layer pattern 116a may not be exposed. Meanwhile, the hard mask patterns 110a may be exposed at the image area A and the edge area C where the second absorber layer pattern 116a is not formed.

In example embodiments, the first absorber layer 106 in the edge area C adjacent to the boundary between the black border area B and the edge area C may be etched by the etching process. Further, a portion of the first absorber layer 106 in the edge area C may be etched by the etching process to form an alignment key.

Figure 12:
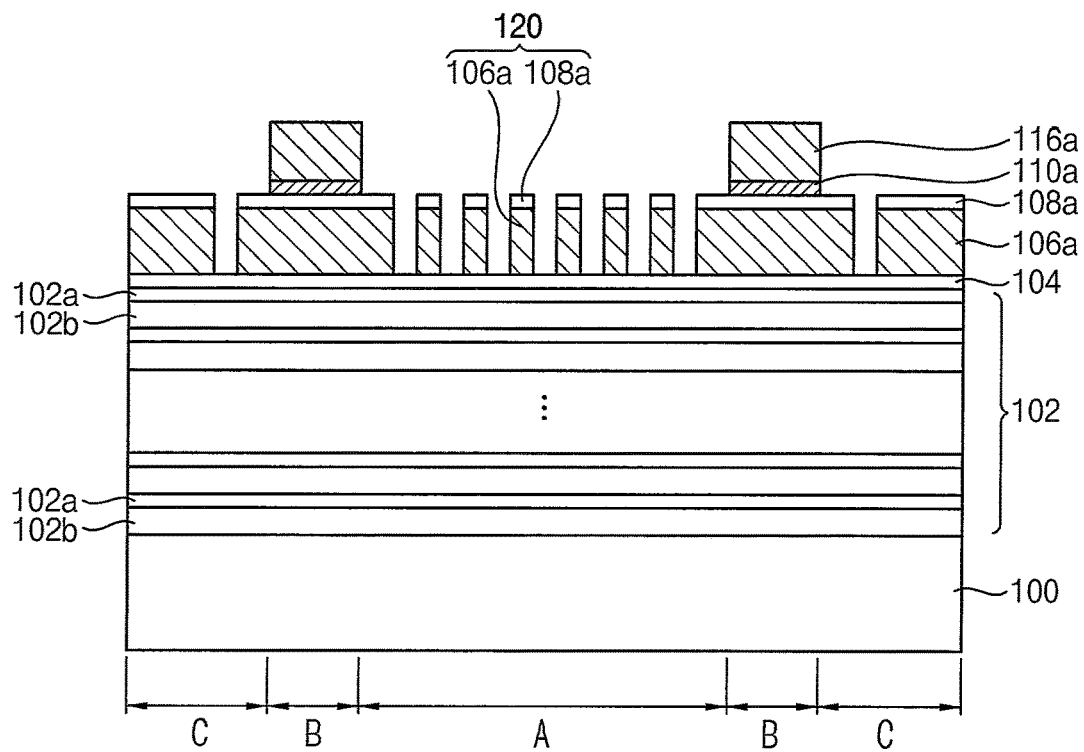

Referring to FIG. 12, exposed hard mask patterns 110a may be removed. As the hard mask patterns 110a in the image area A and the edge area C are removed, the hard mask patterns 110a may not remain in the image area A and the edge area C. On the other hand, the hard mask pattern 110a in the black border area B may remain without removing.

Thus, the main patterns 120, in which the first absorber layer pattern 106a and the ARC layer pattern 108a are stacked, may be formed on the capping layer 104 in the image area A. the first absorber layer pattern 106a and the ARC layer pattern 108a may be stacked on the capping layer 104 in the edge area C. Further, the alignment key may be formed on the capping layer 104 in the edge area C.

The absorber structure, in which the first absorber layer pattern 106a, the ARC layer pattern 108a, the hard mask pattern 110a, and the second absorber layer pattern 116a are stacked, may be formed on the capping layer 104 in the black border area B. That is, the ARC layer pattern 108a and the hard mask pattern 110a may be interposed between the first absorber layer pattern 106a and the second absorber layer pattern 116a in the vertical direction.

By the above process, the reticle 40 may be manufactured. The reticle 40 may include the main patterns 120 with the first absorber layer patterns 106a in the image area A, and the absorber layer structure with the first absorber layer pattern 106a, the hard mask pattern 110a, and the second absorber layer pattern in the black border area B. Thus, the EUV light reflected from the multi-layer structure 102 may be effectively absorbed in the black border area B by the absorber layer structure. When the EUV exposure process is performed using the reticle 40, patterns may be accurately formed at an edge region of a semiconductor chip.

Figure 13:
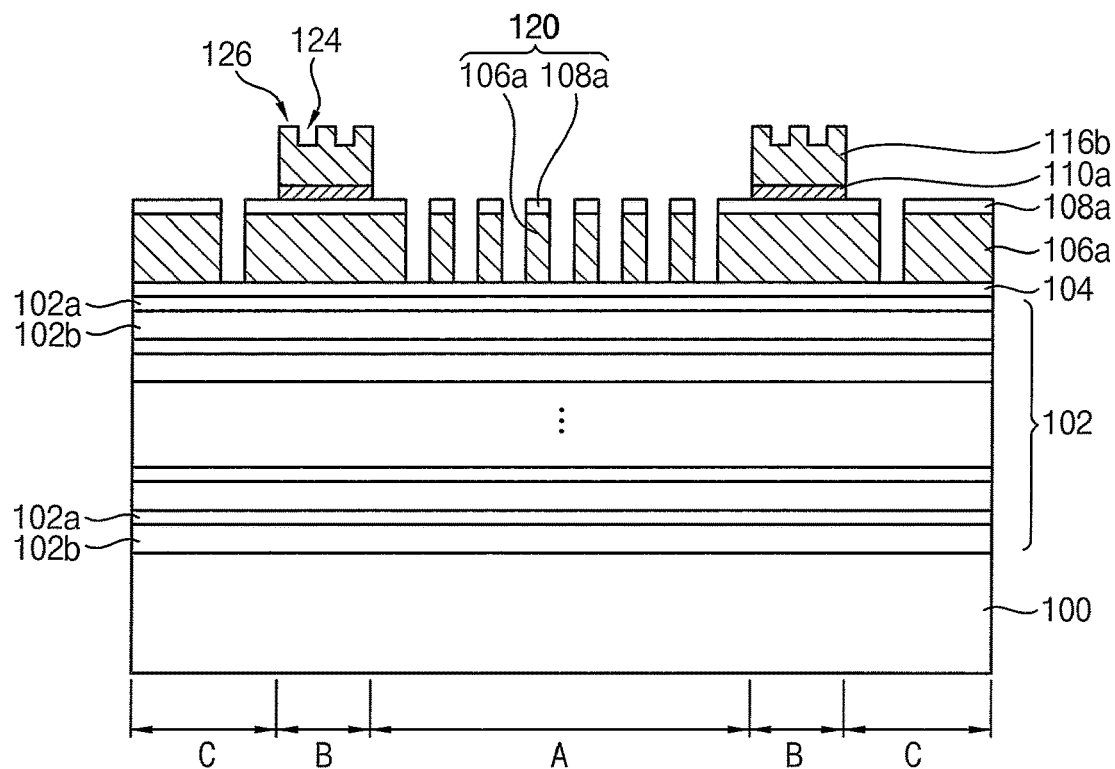
FIG. 13 is a cross-sectional view of a reticle in accordance with example embodiments.

FIG. 13 is a cross-sectional view of a reticle in accordance with example embodiments.

The reticle shown in FIG. 13 may be substantially the same as the reticle 40 shown in FIG. 3, except for a shape of the second absorber layer pattern. Therefore, redundant descriptions are omitted.

Referring to FIG. 13, an absorber layer structure, including the first absorber layer pattern 106a, the ARC layer pattern 108a, the hard mask pattern 110a, and a second absorber layer pattern 116b sequentially stacked, may be formed on the capping layer 104 in the black border area B. The second absorber layer pattern 116b may cover an upper surface of the hard mask pattern 110a. A lower surface of the second absorber layer pattern 116b may be substantially flat.

In example embodiments, an upper surface of the second absorber layer pattern 116b may include recesses 124 and protrusions 126. That is, the upper surface of the second absorber layer pattern 116b may have a patterned shape. The hard mask pattern 110a may not be exposed by the recesses 124.

The recesses 124 and protrusions 126 included at the upper surface of the second absorber layer pattern 116b may scatter light having a wavelength different from that of the EUV light. Thus, light having a wavelength different from that of the EUV light may not be guided to a target semiconductor wafer. In example embodiments, the recesses 124 and the protrusions 126 may be disposed so as to scatter light having a wavelength of about 150 nm to about 300 nm. For example, a width of each of the recesses 124 and a width of each of the protrusions 126 may be adjusted to scatter the light.

A thickness from bottoms of the recesses 124 to a bottom of the second absorber layer pattern 116b may have a first thickness so as to completely absorb the EUV light in the black border area B. In example embodiments, the first thickness of the second absorber layer pattern 116b may be adjusted so that the OD of the absorber layer structure may be greater than 2.8.

When the reticle of FIG. 13 is used, the EUV light may be completely absorbed in the black border area B. In addition, light having a wavelength different from that of the EUV light may be scattered in the black border area B, so that light having a wavelength different from that of the EUV light may not be guided to the target semiconductor wafer.

Therefore, a target photoresist pattern may be formed on the target semiconductor wafer by an exposure process using the reticle of FIG. 13. Also, defects of the photoresist pattern may not occur at an edge region of a semiconductor chip.

FIGS. 14 to 19 are cross-sectional views illustrating a method of manufacturing the reticle of FIG. 13.

Figure 14:
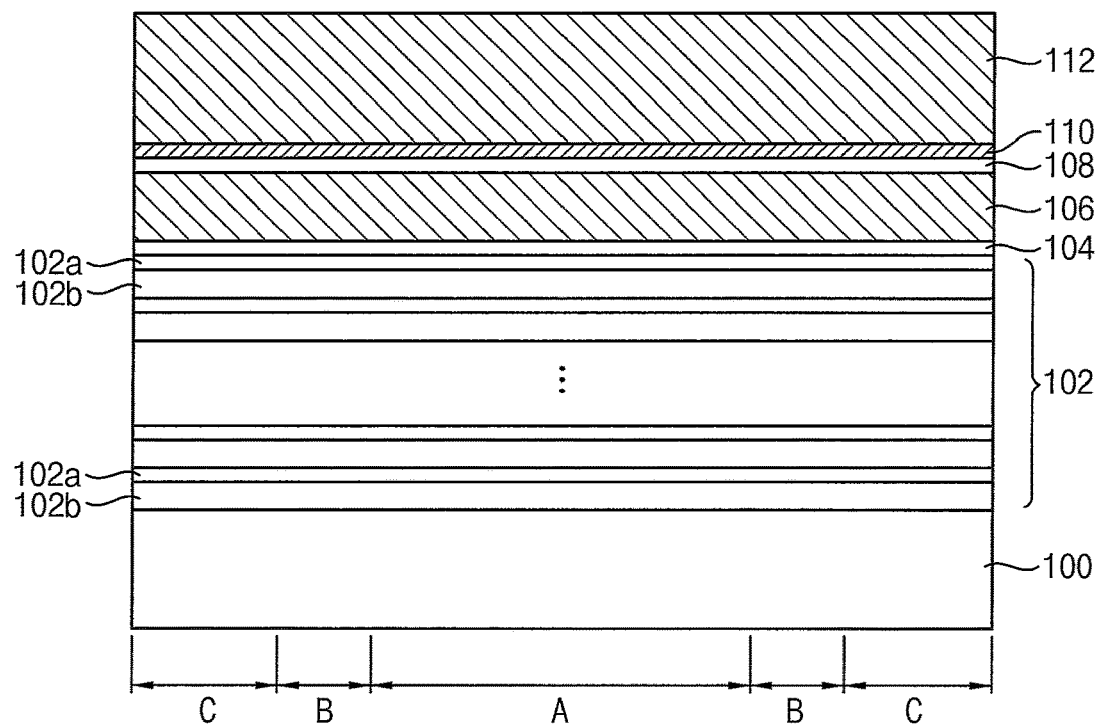
FIGS. 14 to 19 are cross-sectional views of stages in a method of manufacturing a reticle in accordance with example embodiments.

Referring to FIG. 14, processes described with reference to FIGS. 5 and 6 may be performed to form the multi-layer structure 102, the capping layer 104, the first absorber layer 106, the ARC layer 108, the hard mask layer 110, and the second absorber layer 112 on the image area A, the black border area B, and the edge area C of the substrate.

The second absorber layer 112 may be formed to have a thickness greater than a target thickness of the second absorber layer pattern subsequently formed. The second absorber layer 112 may be partially etched in a subsequent etching process for patterning the first absorber layer 106. In addition, in the subsequent etching process, a hard mask pattern may not be exposed at a recessed portion on an upper surface of the second absorber layer 112. Thus, the thickness of the second absorber layer 112 may be greater than the thickness of the second absorber layer pattern in consideration of the thickness of the second absorber layer 112 to be etched. For example, the thickness of the second absorber layer 112 may be greater than the thickness of the second absorber layer shown in FIG. 6 having a flat top surface.

Figure 15:
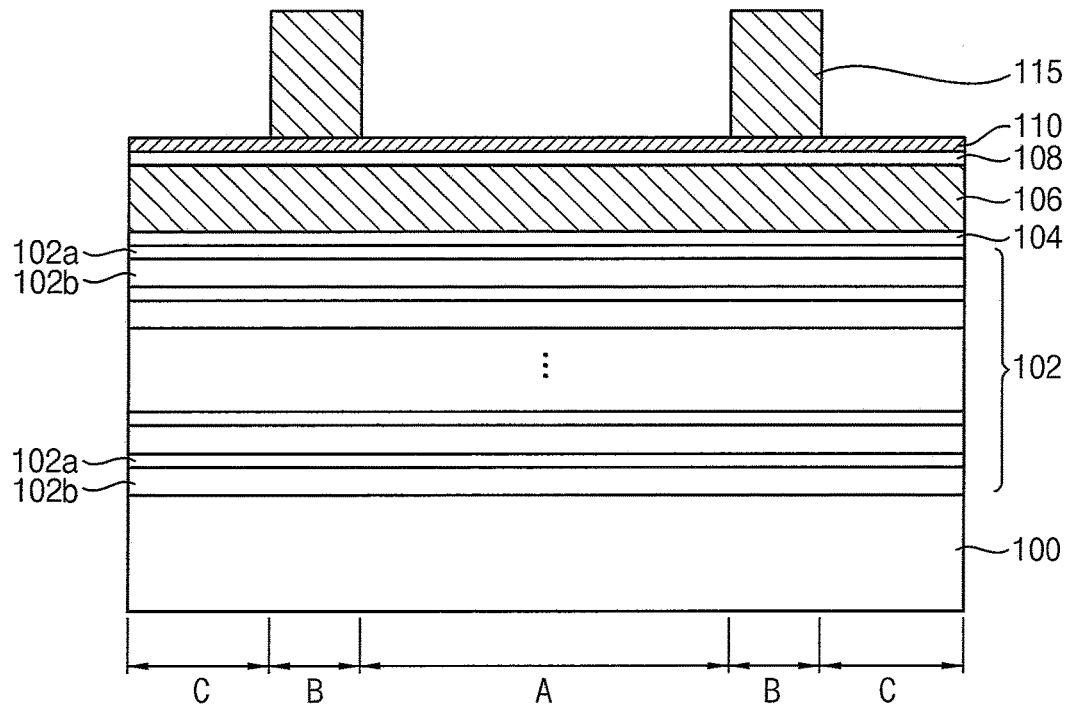

Referring to FIG. 15, a first photoresist pattern may be formed on the second absorber layer 112, and the second absorber layer 112 may be etched using the first photoresist pattern as an etching mask to form a preliminary second absorber layer pattern 115. The processes may be substantially the same as described with reference to FIGS. 7 and 8.

Figure 16:
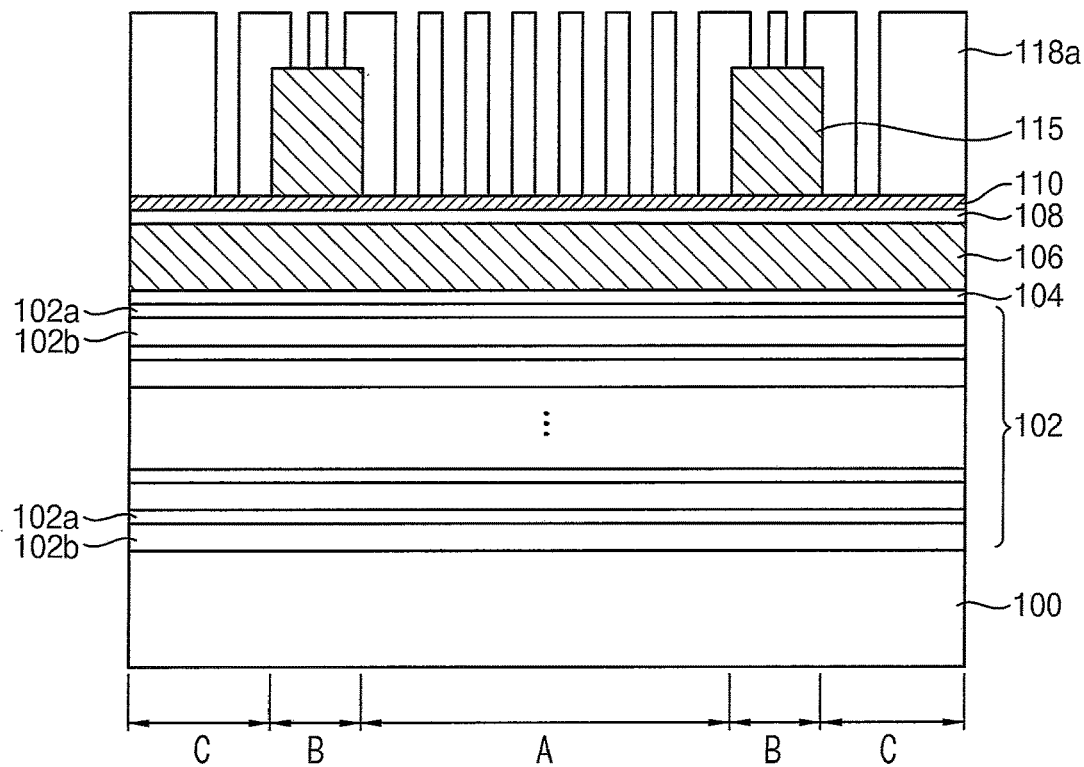

Referring to FIG. 16, a second photoresist layer may be coated to cover the preliminary second absorber layer pattern 115 and the hard mask layer 110. Thereafter, a second photoresist pattern 118a may be formed on the preliminary second absorber layer pattern 115 and the hard mask layer 110 by a photo process.

The second photoresist pattern 118a may serve as an etching mask for forming recesses on an upper surface of the preliminary second absorber layer pattern 115 in the black border area B. In addition, the second photoresist pattern 118a may serve as an etching mask for forming a hard mask pattern for forming a main pattern in the image area A. The second photoresist pattern 118a may cover the hard mask layer 110 on the edge area C.

An opening between a plurality of second photoresist patterns 118a may be formed in the image area A. In example embodiments, an opening between the second photoresist patterns 118a may be further formed in the edge area C adjacent to a boundary between the black border area B and the edge area C.

Figure 17:
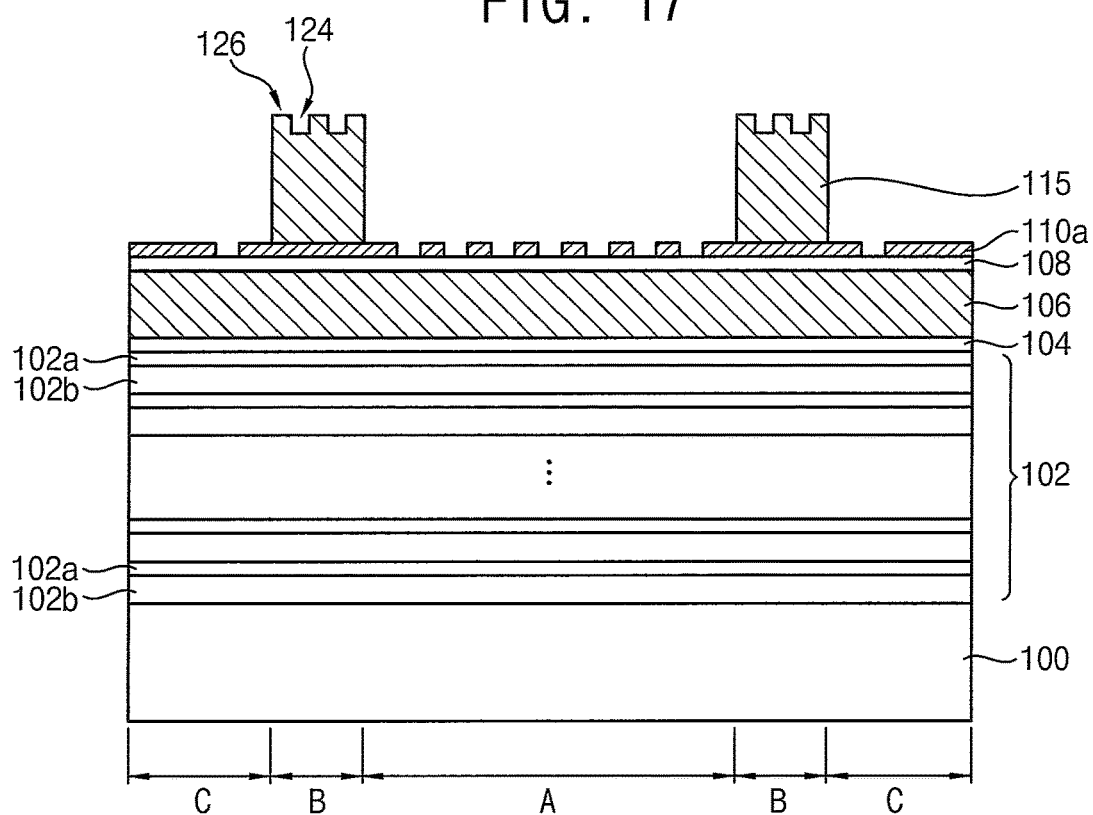

Referring to FIG. 17, upper portions of the hard mask layer 110 and the preliminary second absorber layer pattern 115 may be etched using the second photoresist pattern 118a as an etching mask. Thus, the hard mask patterns 110a may be formed in the image area A and the edge area C. In addition, the recesses 124 and the protrusions 126 may be formed on an upper surface of the preliminary second absorber layer pattern 115. An upper surface of the ARC layer 108 may be exposed between the hard mask patterns 110a.

During the etching, the second photoresist pattern 118a may be mostly removed. After performing the etching process, remaining portions of the second photoresist pattern 118a may be removed by a stripping process.

Figure 18:
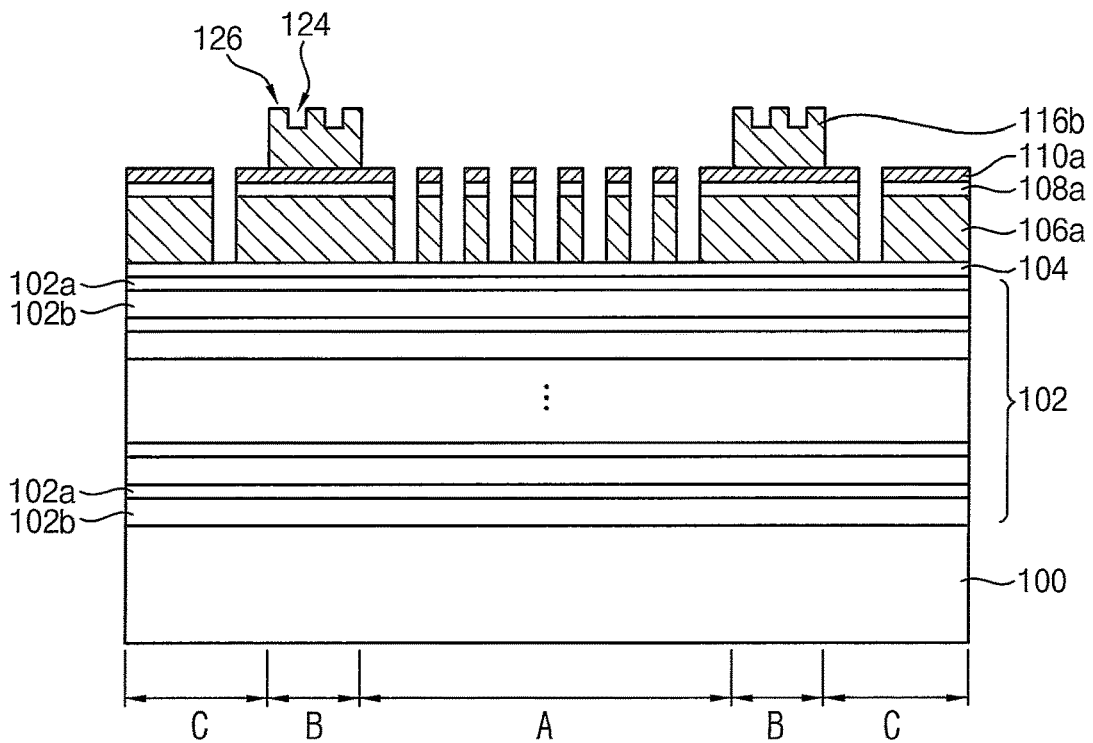

Referring to FIG. 18, the ARC layer 108 and the first absorber layer 106 may be sequentially and anisotropically etched using the hard mask patterns 110a as an etching mask. During the etching process, an upper portion of the preliminary second absorber layer pattern 115 may be partially etched. Thus, a thickness of the preliminary second absorber layer pattern 115 may be reduced to form the second absorber layer pattern 116b. In the etching process, the preliminary second absorber layer pattern 115 may be partially etched so that the hard mask pattern 110a may not be exposed by the recesses 124.

When the etching process is performed, main patterns in which the first absorber layer pattern 106a and the ARC layer pattern 108a are stacked may be formed on the image area A. In addition, the second absorber layer pattern 116b including recesses 124 and protrusions 126 may be formed in the black border area B.

In example embodiments, the first absorber layer 106 in the edge area C adjacent to the boundary between the black border area B and the edge area C may be etched by the etching process. Further, a portion of the first absorber layer 106 of the edge area C may be etched by the etching process to form an alignment key.

Figure 19:
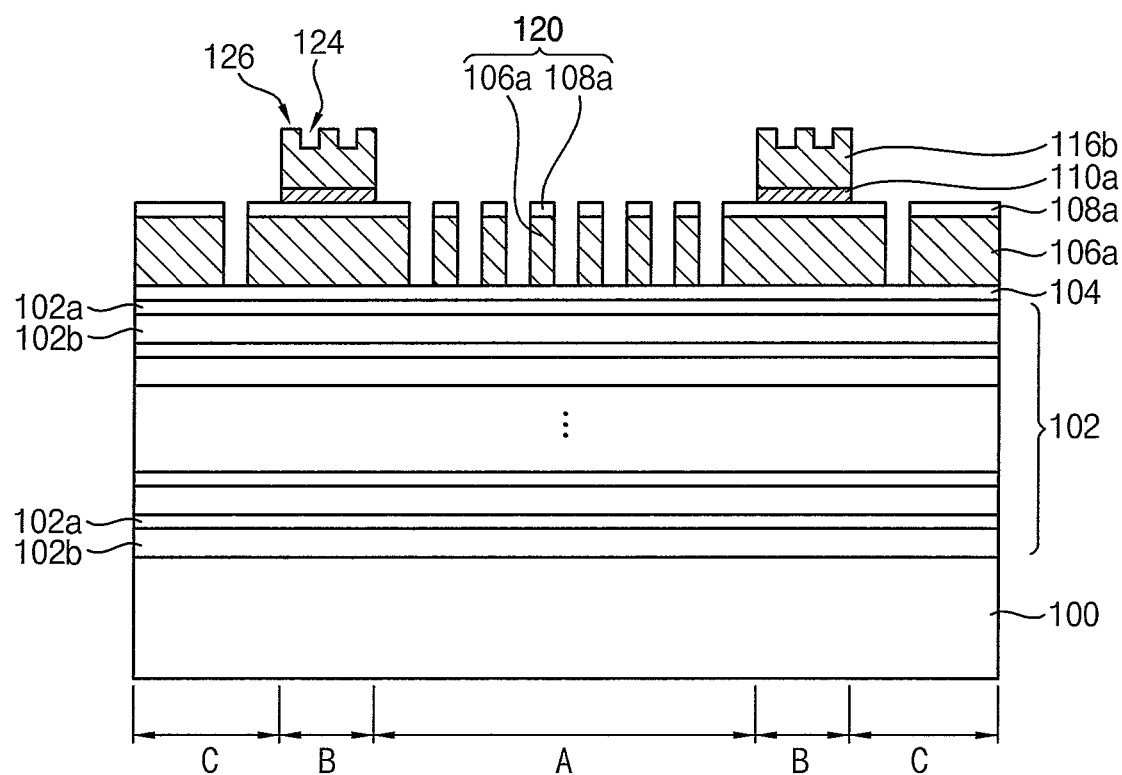

Referring to FIG. 19, exposed hard mask patterns 110a may be removed. The process may be substantially the same as that illustrated with reference to FIG. 12. By the above process, a reticle may be manufactured.

By way of summation and review, in an EUV exposure process, a pattern may not be formed in a portion of an image area that is adjacent to a black border area of the reticle, as light at the black border area may affect an imaging of an edge region of the image region. In contrast, in accordance with example embodiments, a reticle of an EUV exposure apparatus includes a black border area with a stack of a first absorber layer pattern, a hard mask pattern, and a second absorber layer pattern. Thus, the EUV light may be completely absorbed in the black border area of the reticle. In addition, the hard mask pattern and the second absorber layer pattern may be accurately positioned on the black border area, e.g., to completely cover only the black border area, thereby reducing defects of patterns at an edge region of a semiconductor chip during an exposure process using the reticle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reticle in an apparatus for extreme ultraviolet (EUV) exposure, the reticle comprising:

a substrate including an image area and a black border area surrounding the image area;

a multi-layer structure on the image area and the black border area of the substrate, the multi-layer structure to reflect EUV light;

a capping layer covering the multi-layer structure;

first absorber layer patterns on the capping layer in the image area and the black border area; and an absorber structure on the capping layer in the black border area, the absorber structure including one of the first absorber layer patterns, a hard mask pattern, and a second absorber layer pattern sequentially stacked, the absorber structure covering an entire upper surface of the capping layer in the black border area.

2. The reticle as claimed in claim 1, further comprising anti-reflection coating layer patterns contacting upper surfaces of the first absorber layer patterns in the image area and the black border area, respectively.

3. The reticle as claimed in claim 1, wherein the hard mask pattern includes a material having a high etch selectivity with respect to the first absorber layer patterns.

4. The reticle as claimed in claim 1, wherein the hard mask pattern includes chromium, chromium nitride, silicon oxynitride, or silicon nitride.

5. The reticle as claimed in claim 1, wherein a thickness of the hard mask pattern is less than a thickness of the first absorber layer patterns.

6. The reticle as claimed in claim 5, wherein the thickness of the hard mask pattern is 3 nm to 20 nm, and the thickness of the first absorber layer patterns is more than 20 nm and less than 60 nm.

7. The reticle as claimed in claim 1, wherein an optical density of the absorber structure for EUV light is higher than 2.8.

8. The reticle as claimed in claim 1, wherein the second absorber layer pattern includes nickel, nickel alloy, tantalum, tantalum alloy, platinum, or platinum alloy.

9. The reticle as claimed in claim 1, wherein an upper surface of the second absorber layer pattern is substantially flat.

10. The reticle as claimed in claim 1, wherein an upper surface of the second absorber layer pattern includes recesses and protrusions, the hard mask pattern not being exposed by the recesses.

11. The reticle as claimed in claim 10, wherein the recesses and the protrusions are arranged to scatter light having a wavelength of 150 nm to 300 nm.

12. The reticle as claimed in claim 1, wherein the substrate further includes:

an edge area surrounding an outside of the black border area; and a stack including a portion of the multi-layer structure, a portion of the capping layer, and one of the first absorber layer patterns on the edge area of the substrate.

13. A reticle in an apparatus for extreme ultraviolet (EUV) exposure, the reticle comprising:

a substrate including an image area, a black border area surrounding the image area, and an edge area surrounding an outside of the black border area;

a multi-layer structure on the image area, the black border area, and the edge area of the substrate, the multi-layer structure to reflect EUV light;

a capping layer covering the multi-layer structure;

first absorber layer patterns on the capping layer in the image area, the black border area, and the edge area; and an absorber structure on the capping layer in the black border area, the absorber layer structure including one of the first absorber layer patterns, a hard mask pattern, and a second absorber layer pattern sequentially stacked, an optical density of the absorber structure for EUV light being higher than 2.8, and the absorber structure covering an entire upper surface of the capping layer in the black border area.

14. The reticle as claimed in claim 13, wherein a thickness of the hard mask pattern is less than a thickness of the first absorber layer patterns.

15. The reticle as claimed in claim 13, wherein the second absorber layer pattern includes nickel, nickel alloy, tantalum, tantalum alloy, platinum, or platinum alloy.

16. The reticle as claimed in claim 13, wherein an upper surface of the second absorber layer pattern is substantially flat.

17. The reticle as claimed in claim 13, wherein an upper surface of the second absorber layer pattern includes recesses and protrusions, the hard mask pattern not being exposed by the recesses.

18. A reticle in an apparatus for extreme ultraviolet (EUV) exposure, the reticle comprising:

a substrate including an image area, a black border area surrounding the image area, and an edge area surrounding an outside of the black border area;

a multi-layer structure on the image area, the black border area, and the edge area of the substrate, the multi-layer structure to reflect EUV light;

a capping layer covering the multi-layer structure;

main patterns on the capping layer in the image area, each of the main patterns including a stack of a first absorber layer pattern and an anti-reflection coating layer pattern;

a stacked structure on the capping layer in the edge area, the stacked structure including the stack of the first absorber layer pattern and the anti-reflection coating layer pattern; and an absorber structure on the capping layer in the black border area, the absorber layer structure including a stack of the first absorber layer pattern, the anti-reflective coating layer pattern, a hard mask pattern, and a second absorber layer pattern sequentially stacked, a thickness of the hard mask pattern being less than that of the first absorber layer pattern, and the absorber structure covering an entire upper surface of the capping layer in the black border area.

19. The reticle as claimed in claim 18, wherein an upper surface of the second absorber layer pattern includes recesses and protrusions, the hard mask pattern not being exposed by the recesses.

20. The reticle as claimed in claim 18, wherein the hard mask pattern has a thickness of 3 nm to 20 nm, and the first absorber layer pattern has a thickness of more than 20 nm and less than 60 nm.

* * * * *